(12) United States Patent  
Di et al.

(10) Patent No.: US 11,965,998 B2  
(45) Date of Patent: Apr. 23, 2024

(54) TRAINING A MACHINE LEARNING SYSTEM USING HARD AND SOFT CONSTRAINTS

(71) Applicant: Schlumberger Technology Corporation, Sugar Land, TX (US)

(72) Inventors: Haibin Di, Houston, TX (US); Cen Li, Houston, TX (US); Aria Abubakar, Houston, TX (US); Stewart Smith, Tananger (NO)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 393 days.

(21) Appl. No.: 17/595,021

(22) PCT Filed: May 11, 2020

(86) PCT No.: PCT/US2020/032334  
§ 371 (c)(1),  
(2) Date: Nov. 5, 2021

(87) PCT Pub. No.: WO2020/231918  
PCT Pub. Date: Nov. 19, 2020

(65) Prior Publication Data  
US 2022/0206175 A1 Jun. 30, 2022

Related U.S. Application Data

(60) Provisional application No. 62/847,250, filed on May 13, 2019.

(51) Int. Cl.  
*G01V 1/30* (2006.01)  
*G06N 3/08* (2023.01)  
(Continued)

(52) U.S. Cl.  
CPC .............. *G01V 1/301* (2013.01); *G06N 3/08* (2013.01); *G01V 20/00* (2024.01);  
(Continued)

(58) Field of Classification Search  
USPC .......................................................... 702/14  
See application file for complete search history.

(56) References Cited

U.S. PATENT DOCUMENTS

2009/0262603 A1 10/2009 Hurley et al.  
2013/0018642 A1* 1/2013 Mifflin .................. G05B 17/02  
703/10  
(Continued)

FOREIGN PATENT DOCUMENTS

WO 2018/096309 A1 5/2018

OTHER PUBLICATIONS

International Search report and Written Opinion of the Equivalent PCT/US2020/032334 dated Aug. 20, 2020.  
(Continued)

*Primary Examiner* — Paul D Lee  
(74) *Attorney, Agent, or Firm* — Jeffrey D. Frantz (57) ABSTRACT

A computer-implemented method includes receiving a test seismic dataset associated with a known truth interpretation, receiving one or more hard constraints, training a machine learning system based on the test seismic dataset, the known truth interpretation, and the one or more hard constraints, determining an error value based on the training the machine learning system, adjusting the error value based on one or more soft constraints, updating the training of the machine learning system based on the adjusted error value, receiving a second seismic dataset after the updating the training; applying the second seismic dataset to the machine learning system to generate an interpretation of the second seismic dataset, generating a seismic image representing a subter-  
(Continued)

ranean domain based on the interpretation of the second seismic dataset, and outputting the seismic image.

20 Claims, 8 Drawing Sheets

(51) Int. Cl.
    *G01V 20/00*     (2024.01)
    *G06F 30/27*     (2020.01)

(52) U.S. Cl.
    CPC ............... *G01V 2210/612* (2013.01); *G01V 2210/6161* (2013.01); *G01V 2210/642* (2013.01); *G01V 2210/646* (2013.01); *G06F 30/27* (2020.01)

(56) References Cited

U.S. PATENT DOCUMENTS

| | | |
|---|---|---|
| 2019/0043193 A1 | 2/2019 | Odaibo et al. |
| 2019/0064389 A1 | 2/2019 | Denli et al. |
| 2019/0112914 A1 | 4/2019 | Chen et al. |
| 2020/0183047 A1* | 6/2020 | Denli ................. G01V 20/00 |
| 2020/0184374 A1* | 6/2020 | Liu .................. G06F 16/2246 |
| 2022/0121987 A1* | 4/2022 | Grady ................ G06N 20/00 |
| 2022/0299952 A1* | 9/2022 | Salhov .............. G05B 13/027 |

OTHER PUBLICATIONS

Wrona et al. Seismic Facies Analysis Using Machine Learning. Geophysics. Sep. 5, 2018, vol. 83, No. 5, pp. O83-O95. abstract, pp. O83-O93, figures 3, 7.

Yao, K. et al., "Hydrocarbon Reservoir Prediction Using Support Vector Machines", Electronic Publishing, Artistic Imaging, and Digital Typography; (Lecture Notes in Computer Science, 2004, 1), pp. 537-542.

Van Der Baan, M. et al., "Neural networks in geophysical applications", Geophysics, 2000, 65(4), 16 pages.

Araya-Polo, M. et al., "Automated fault detection without seismic processing", The Leading Edge, 2017, 36(3), pp. 208-214.

Extended Search Report issued in European Patent Application No. 20806897.3 dated Dec. 19, 2022, 7 pages.

* cited by examiner

TRAINING A MACHINE LEARNING SYSTEM USING HARD AND SOFT CONSTRAINTS

CROSS-REFERENCE TO RELATED APPLICATIONS

This application is a National Stage Entry of International Application No. PCT/US2020/032334, filed May 11, 2020, which claims the benefit of U.S. Provisional Application No. 62/847,250, filed May 13, 2019.

BACKGROUND

Interpretation of geological structures and stratigraphic sequences within seismic datasets is a component of petroleum exploration and production. Due to the geological complexities in the subsurface and limitations associated with seismic imaging resolution, efficient, accurate, repeatable, and consistent interpretation is challenging. Manual interpretation by an experienced interpreter may be relatively accurate and reliable. However, the manual interpretation process is labor-intensive, time-consuming, and sensitive to interpreter bias, particularly with increasing quantities of costly seismic datasets and complexities of subsurface geology.

SUMMARY

Embodiments of the disclosure may provide a computer-implemented method including receiving a test seismic dataset associated with a known truth interpretation, receiving one or more hard constraints, and training a machine learning system based on the test seismic dataset, the known truth interpretation, and the one or more hard constraints. The method further includes determining an error value based on the training the machine learning system, adjusting the error value based on one or more soft constraints, updating the training of the machine learning system based on the adjusted error value, receiving a second seismic dataset after the updating the training, applying the second seismic dataset to the machine learning system to generate an interpretation of the second seismic dataset, generating a seismic image representing a subterranean domain based on the interpretation of the second seismic dataset, and outputting the seismic image.

Embodiments of the disclosure may also provide a computing system, including one or more processors and a memory system comprising one or more non-transitory computer-readable media storing instructions that, when executed by at least one of the one or more processors, cause the computing system to perform operations. The operations may include receiving a test seismic dataset associated with a known truth interpretation, receiving one or more hard constraints, training a machine learning system based on the test seismic dataset, the known truth interpretation, and the one or more hard constraints. The one or more hard constraints represent an interpretation of the test seismic data by a separate machine learning system. The operations may further include determining an error value based on the training the machine learning system, adjusting the error value based on one or more soft constraints, updating the training of the machine learning system based on the adjusted error value, and receiving a second seismic dataset after the updating the training. The operations may further include applying the second seismic dataset to the machine learning system to generate an interpretation of the second seismic dataset, generating a seismic image representing a subterranean domain based on the interpretation of the second seismic dataset, and outputting the seismic image.

Embodiments of the disclosure may further provide a non-transitory computer-readable medium storing instructions that, when executed by one or more processors of a computing system, cause the computing system to perform operations. The operations include receiving a test seismic dataset associated with a known truth interpretation, generating an interpretation determination algorithm by associating the test seismic dataset with the known truth interpretation, determining an error value associated with the interpretation determination algorithm, adjusting the error value based on one or more soft constraints, and updating the interpretation determination algorithm based on the adjusted error value. The operations further include receiving a second seismic dataset after the updating the interpretation determination algorithm, applying the second seismic dataset to the interpretation determination algorithm to generate an interpretation of the second seismic dataset, generating a seismic image representing a subterranean domain based on the interpretation of the second seismic dataset, and outputting the seismic image.

It will be appreciated that this summary is intended merely to introduce some aspects of the present methods, systems, and media, which are more fully described and/or claimed below. Accordingly, this summary is not intended to be limiting.

BRIEF DESCRIPTION OF THE DRAWINGS

The accompanying drawings, which are incorporated in and constitute a part of this specification, illustrate embodiments of the present teachings and together with the description, serve to explain the principles of the present teachings. In the figures.

DETAILED DESCRIPTION

Embodiments of the present disclosure may include a computer-based seismic interpretation system that interprets seismic data using an interpretation algorithm that is generated using machine learning. More specifically, embodiments may include a technique for training a machine learning system to generate and update an interpretation algorithm that may be used to accurately and quickly interpret seismic data. In some embodiments, the machine learning system may be trained by associating test seismic data with a known truth representing a true interpretation of the test seismic data (e.g., an interpretation consistent with a predefined "ground truth" or verified interpretation). Additionally, the machine learning system may be trained by associating a "hard" constraint and the test seismic data with the known truth. That is, the hard constraint may be introduced at the front-end of the machine learning process. Further, the machine learning system may be trained by introducing a "soft" constraint at the back-end of the machine learning process (e.g., an error determination process). For example, error of the machine learning system is determined by inputting a seismic dataset with a known interpretation, and comparing the known interpretation with the interpretation produced by the machine learning system. The error is considered to be the difference or deviation between the known interpretation and the interpretation produced by the machine learning system.

In some embodiments, the soft constraint may include a policy that adjusts or corrects a determined error. The adjusted error may be used, for example, as part of back propagation to determine weights to apply when using the trained machine learning system to interpret operational seismic data (e.g., seismic data in which the interpretation is unknown, and to be determined by the trained machine learning system).

As described herein, training with the hard constraint may provide the machine learning system with an additional datapoint or point of reference to interpret seismic data more accurately in operation. In other words, the hard constraint may be used to more accurately interpret the seismic data by introducing an additional datapoint that may distinguish similar seismic datasets. Examples of hard constraints may include legacy information about the study area from a previous geological survey, geologic/geophysical measurements, a fault distribution indicative of the structural deformation history, etc. Generally, a hard constraint may be considered to be objective and/or measurable.

Training with one or more soft constraints may provide the machine learning system with the ability to adjust error rates and update an interpretation algorithm accordingly, thus more accurately interpreting seismic data. Examples of soft constraints may include priority information, uncertainty levels, interpretation preference at specific stratigraphic intervals, etc. Generally, a soft constraint may include an error adjustment policy and may be used to refine, adjust, or guide the machine learning interpretation. In some embodiments, the adjusted error rate may be used in back propagation to adjust weights, which are then used by the machine learning system as part of seismic data interpretation.

In some embodiments, machine learning training may use a single hard constraint, a single soft constraint, multiple hard constraints, multiple soft constraints, or a combination thereof. Also, hard constraints and soft constraints may potentially be interchangeable. For example, a hard constraint can be used as a soft constraint, and vice versa. Any machine learning algorithm may be trained using the processes in accordance with aspects of the present disclosure, including a convolutional neural network, 3D algorithms, etc.

Aspects of the present disclosure may improve the speed, accuracy, and repeatability of seismic interpretation, which results in the improvement of petroleum exploration and production. Aspects of the present disclosure may leverage the use rules (e.g., corresponding to constraints) to transform a subjective process into an objective process using a trained machine learning system (e.g., a trained neural network). In this way, consistency of interpretation is improved, and the amount of human labor resources consumed is drastically reduced. Embodiments of the present disclosure provide a technique for training a machine learning system to allow the machine learning system to perform functions not previously performable on a computer. For example, by training the machine learning system using the techniques described herein, it is now possible to more accurately interpret seismic data by introducing a hard constraint and adjusting error using the soft constraint.

Reference will now be made in detail to embodiments, examples of which are illustrated in the accompanying drawings and figures. In the following detailed description, numerous specific details are set forth in order to provide a thorough understanding of the embodiments described herein. However, it will be apparent to one of ordinary skill in the art that certain embodiments may be practiced without these specific details. In other instances, well-known methods, procedures, components, circuits, and networks have not been described in detail so as not to unnecessarily obscure aspects of the embodiments.

It will also be understood that, although the terms first, second, etc. may be used herein to describe various elements, these elements should not be limited by these terms. These terms are only used to distinguish one element from another. For example, a first object or step could be termed a second object or step, and, similarly, a second object or step could be termed a first object or step, without departing from the scope of the present disclosure. The first object or step, and the second object or step, are both, objects or steps, respectively, but they are not to be considered the same object or step.

The terminology used in the description herein is for the purpose of describing particular embodiments and is not intended to be limiting. As used in this description and the appended claims, the singular forms "a," "an" and "the" are intended to include the plural forms as well, unless the context clearly indicates otherwise. It will also be understood that the term "and/or" as used herein refers to and encompasses any possible combinations of one or more of the associated listed items. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, as used herein, the term "if" may be construed to mean "when" or "upon" or "in response to determining" or "in response to detecting," depending on the context.

Attention is now directed to processing procedures, methods, techniques, and workflows that are in accordance with some embodiments. Some operations in the processing procedures, methods, techniques, and workflows disclosed herein may be combined and/or the order of some operations may be changed.

Figure 1:
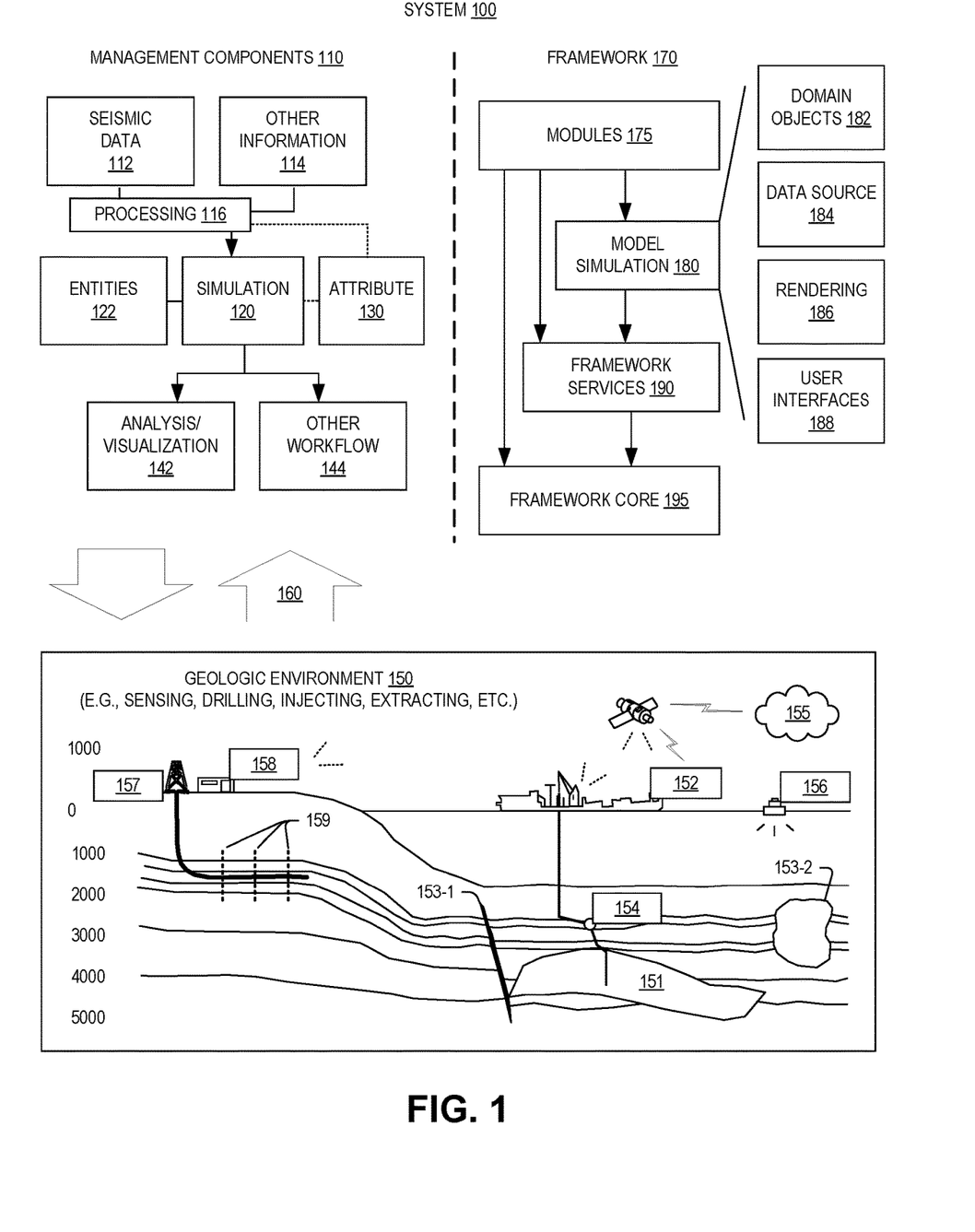
FIG. 1 illustrates an example of a system that includes various management components to manage various aspects of a geologic environment, according to an embodiment.

FIG. 1 illustrates an example of a system 100 that includes various management components 110 to manage various aspects of a geologic environment 150 (e.g., an environment that includes a sedimentary basin, a reservoir 151, one or more faults 153-1, one or more geobodies 153-2, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142 and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, bodies, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may operate in conjunction with a software framework such as an object-based framework. In such a framework, entities may include entities based on pre-defined classes to facilitate modeling and simulation. A commercially available example of an object-based framework is the MICROSOFT® .NET® framework (Redmond, Washington), which provides a set of extensible object classes. In the .NET® framework, an object class encapsulates a module of reusable code and associated data structures. Object classes can be used to instantiate object instances for use in by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results (e.g., simulation results, etc.). As an example, output from the simulation component 120 may be input to one or more other workflows, as indicated by a workflow component 144.

As an example, the simulation component 120 may include one or more features of a simulator such as the ECLIPSE™ reservoir simulator (Schlumberger Limited, Houston Texas), the INTERSECT™ reservoir simulator (Schlumberger Limited, Houston, Texas), etc. As an example, a simulation component, a simulator, etc. may include features to implement one or more meshless techniques (e.g., to solve one or more equations, etc.). As an example, a reservoir or reservoirs may be simulated with respect to one or more enhanced recovery techniques (e.g., consider a thermal process such as SAGD, etc.).

In an example embodiment, the management components 110 may include features of a commercially available framework such as the PETREL® seismic to simulation software framework (Schlumberger Limited, Houston, Texas). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of modeling, simulating, etc.).

In an example embodiment, various aspects of the management components 110 may include add-ons or plug-ins that operate according to specifications of a framework environment. For example, a commercially available framework environment marketed as the OCEAN® framework environment (Schlumberger Limited, Houston, Texas) allows for integration of add-ons (or plug-ins) into a PETREL® framework workflow. The OCEAN® framework environment leverages .NET® tools (Microsoft Corporation, Redmond, Washington) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization.

As an example, a framework may include features for implementing one or more mesh generation techniques. For example, a framework may include an input component for receipt of information from interpretation of seismic data, one or more attributes based at least in part on seismic data, log data, image data, etc. Such a framework may include a mesh generation component that processes input information, optionally in conjunction with other information, to generate a mesh.

In the example of FIG. 1, the model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

As an example, the domain objects 182 can include entity objects, property objects and optionally other objects. Entity objects may be used to geometrically represent wells, surfaces, bodies, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may include layers (e.g., stratification) that include a reservoir 151 and one or more other features such as the fault 153-1, the geobody 153-2, etc. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally or instead include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL® software, for example, that operates on seismic data, seismic attribute(s), etc. As an example, a workflow may be a process implementable in the OCEAN® framework. As an example, a workflow may include one or more worksteps that access a module such as a plug-in (e.g., external executable code, etc.).

Figure 2:
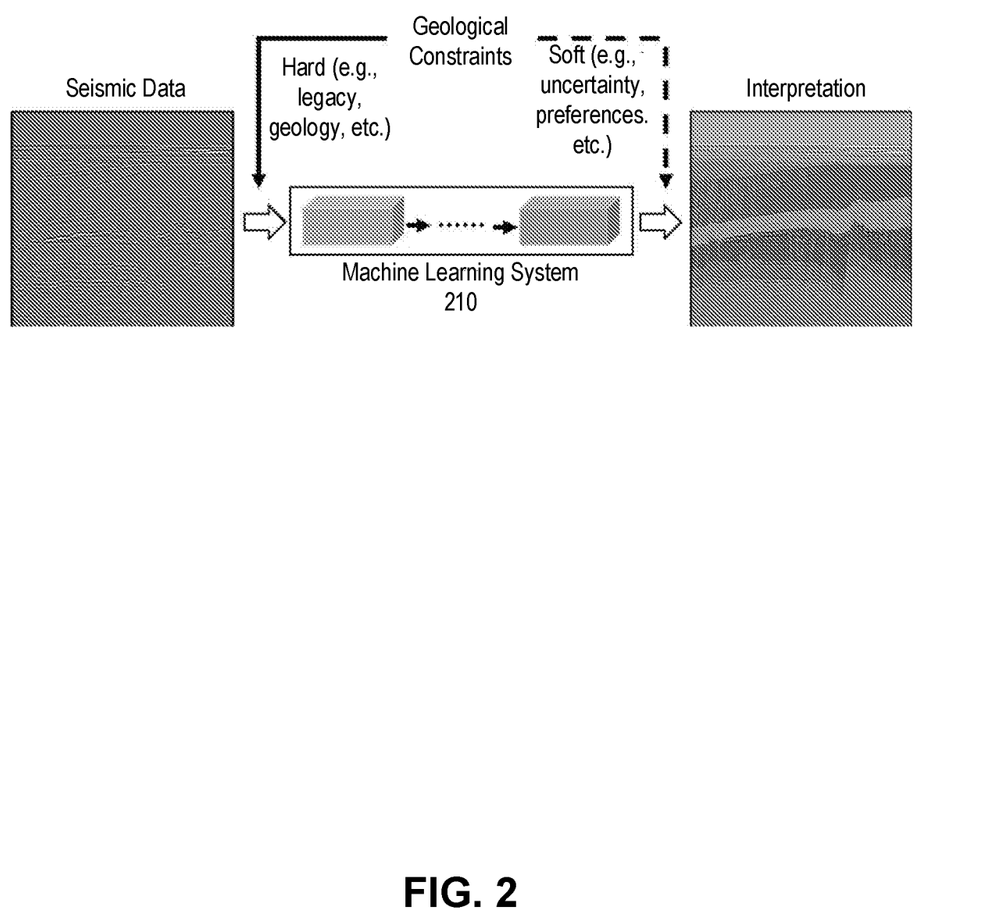
FIG. 2 illustrates an example overview of incorporating hard and soft constraints for training a machine learning system and generating an interpretation algorithm.

FIG. 2 illustrates an example overview of incorporating hard and soft constraints for training a machine learning system 210 and generating an interpretation algorithm. As shown in FIG. 2, a machine learning system 210 may receive a seismic dataset associated with a truth interpretation as part of training the machine learning system 210. To train the machine learning system 210, the seismic dataset and a hard constraint are associated with a corresponding known truth interpretation. The error of the machine learning system 210 is determined by comparing an interpretation produced by the machine learning system 210 with the known truth. The difference between the known truth and the interpretation produced by the machine learning system 210 may represent the error. The soft constraint may be used at the back-end of the training process (e.g., after an initial training using the seismic data and hard constraint). In some embodiments, the soft constraint may be used to adjust the error. In the example in which the machine learning system 210 incorporates a neural network, the error is used in a back-propagation process to determine weightings. Training the machine learning system 210 may involve a number of several iterations (or epochs).

The trained machine learning system 210 may include an interpretation algorithm to interpret seismic data for which the interpretation is unknown. For example, the trained machine learning system 210 may receive input seismic data and (optionally) a hard constraint. The machine learning system 210 may identify an interpretation that substantially matches (e.g., to a threshold degree) the seismic data and the hard constraint. The machine learning system 210 may then apply a corresponding weighting (e.g., which may be determined based on an adjusted error using the soft constraint during the training phase) to arrive at the final interpretation.

Figure 3:
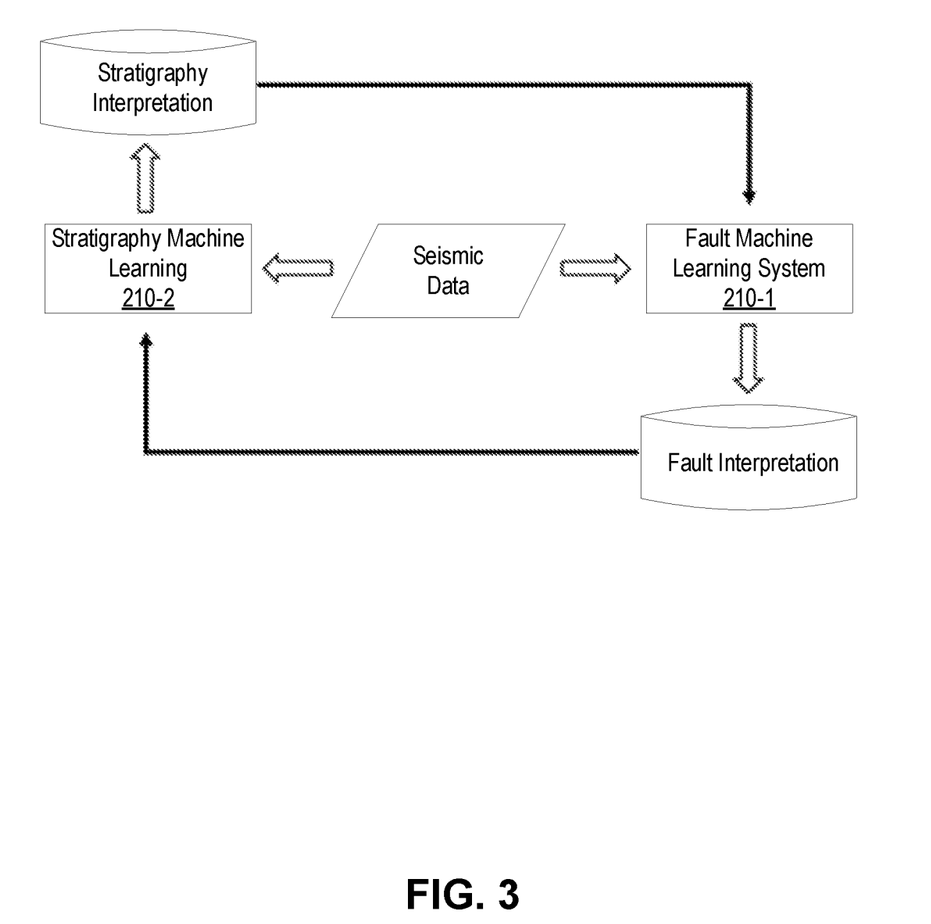
FIG. 3 illustrates an example of using interpretations from different machine learning systems as hard constraints.

FIG. 3 illustrates an example of using interpretations from different machine learning systems as hard constraints. In the example of FIG. 3, one machine learning system 210 (e.g., fault machine learning system 210-1) may interpret input seismic data based on a hard constraint in which the hard constraint includes an interpretation of seismic data previously generated by a different machine learning system 210 (e.g., the stratigraphy machine learning system 210-2). In some embodiments, the interpretations generated by each of the fault machine learning system 210-1 and the stratigraphy machine learning system 210-2 may be iteratively and/or recursively updated based on the most recent interpretation of the other.

As an illustrative example, the fault machine learning system 210-1 may receive seismic data, and a hard constraint corresponding to a stratigraphy interpretation previously generated by the stratigraphy machine learning system 210-2. The fault machine learning system 210-1 may generate a fault interpretation, which is used as an input hard constraint to the stratigraphy machine learning system 210-2, which in turn, generates a stratigraphy interpretation to be used as a hard constraint into the fault machine learning system 210-1. Alternatively, the fault machine learning system 210-1 may receive only the seismic data, and generate a corresponding fault interpretation based only on the seismic data, which is then input as a hard constraint into the stratigraphy machine learning system 210-2. In some embodiments, the initial decision for using one machine learning system 210 over the other to generate an initial interpretation may be chosen by an operator or administrator.

Figure 4:
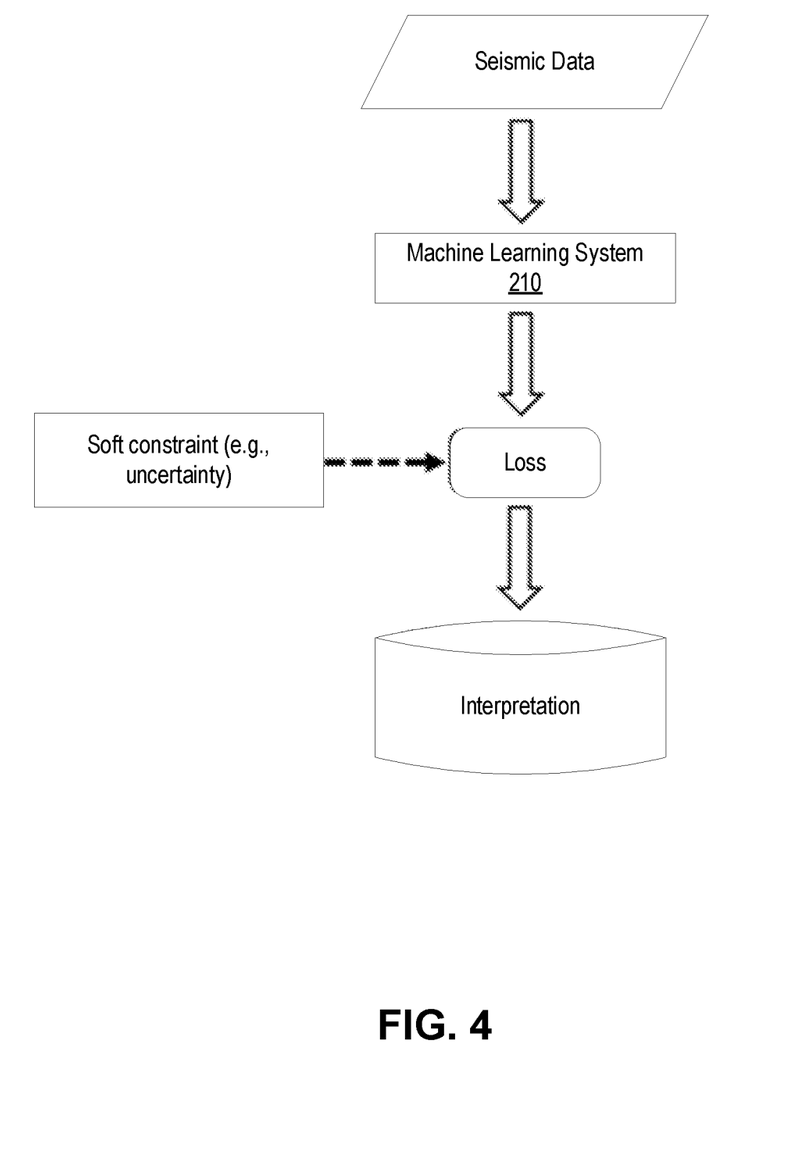
FIG. 4 illustrates an example for training a machine learning system using a soft constraint to interpret seismic data.

FIG. 4 illustrates an example for training a machine learning system 210 using a soft constraint to interpret seismic data. As shown in FIG. 4, the machine learning system 210 may receive seismic data associated with an interpretation truth. As part of training, the machine learning system 210 may determine a loss (or error) representing a deviation between the interpretation produced by the machine learning system 210 and the interpretation truth. The machine learning system 210 may apply a soft constraint (e.g., corresponding to a level of uncertainty in interpretation) to adjust the loss (error) during the training process. Such a constraint may be particularly applicable to seismic datasets where a perceived level of geological or structural complexity exists, or when the dataset features low signal to noise ratio and poor structural imaging quality. In such datasets, interpretational uncertainty may exist, and thus may be considered while training the machine learning system 210 to adjust the error and corresponding weighting as part of the training process.

In some embodiments, the level of uncertainty representing the soft constraint may correspond to an error adjustment policy. For example, the policy may indicate that the error should be adjusted a certain level based on prior knowledge, interpretation preference, or rules to ignore or refrain from factoring in certain types of data in the error calculation. Additionally, or alternatively, the error adjustment policy may be different based on the presence of different hard constraints.

Figure 5:
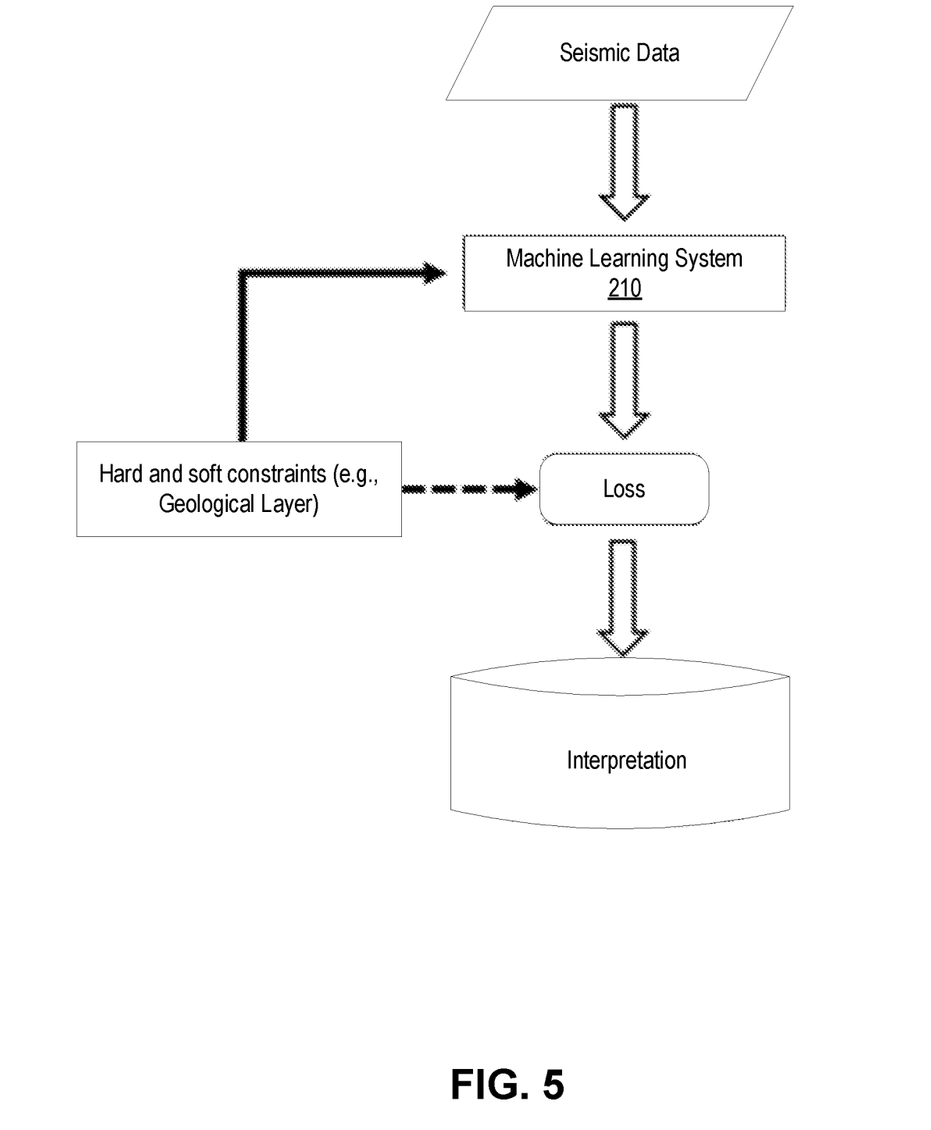
FIG. 5 illustrates an example for training a machine learning system using both a hard and a soft constraint to interpret seismic data.

FIG. 5 illustrates an example for training a machine learning system 210 using both a hard and a soft constraint to interpret seismic data. One example in which both hard and soft constraints may be used for training includes interpretation of a layer-masked fault. This example interpretation may be applicable to reservoir characterization and modeling, since the reservoir interval is considered more important compared to the over or underburned stratigraphy. Therefore, the fault interpretation is expected to mostly focus on the faults constrained within the reservoir interval. Such geological layer-masked fault interpretation may be produced by using seismic stratigraphy as both hard and soft constraints. That is, the machine learning system 210 may be trained using the geological layer data as a hard constraint, and by using the geological layer data as a soft constraint to adjust the error and/or weightings. In some embodiments, the soft constraint may include a policy that defines the manner and level to which to adjust the error based on the values of geological layer data.

Figure 6:
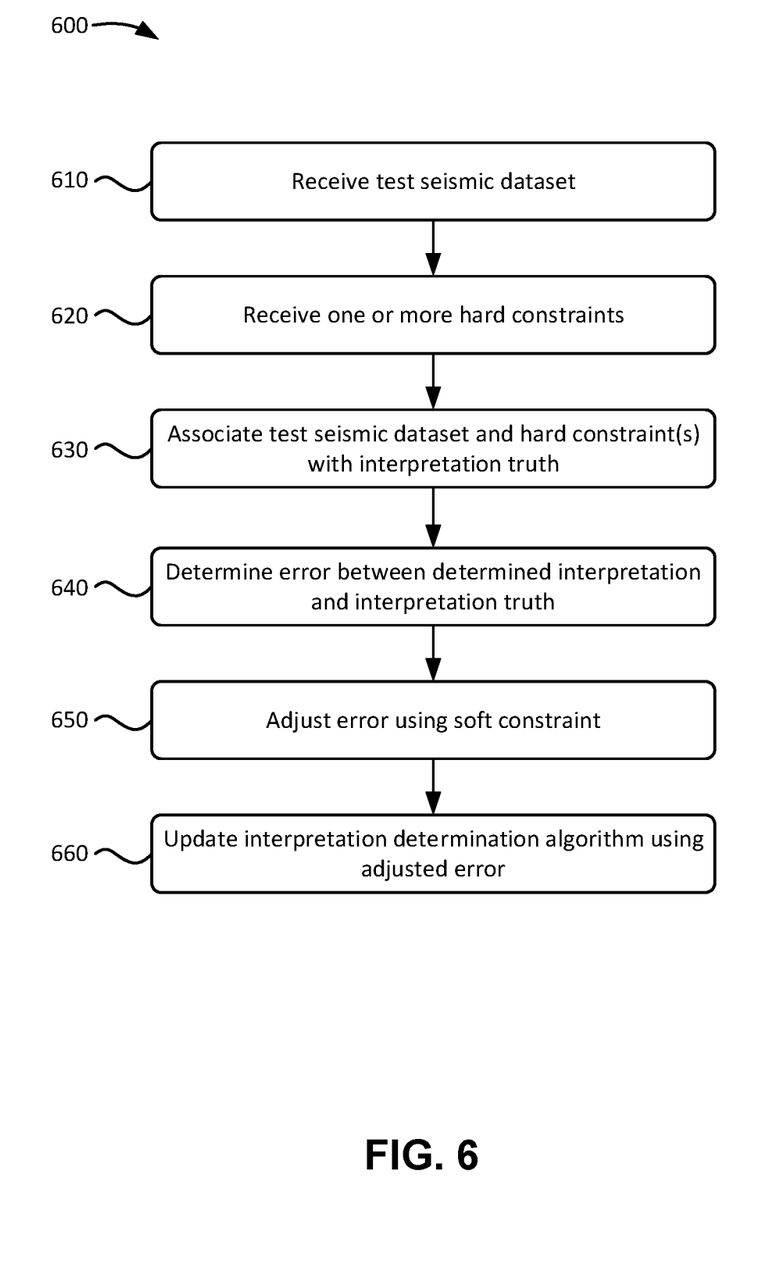
FIG. 6 illustrates an example flowchart of a process for training a machine learning system using hard and/or soft constraints.

FIG. 6 illustrates an example flowchart of a process 600 for training a machine learning system using hard and/or soft constraints. The blocks of FIG. 6 may be implemented by the machine learning system 210 and/or similar type of computing device. As noted above, the flowchart illustrates the architecture, functionality, and operation of possible implementations of systems, methods, and computer program products according to various embodiments of the present disclosure.

As shown in FIG. 6, the process 600 may include receiving a test seismic dataset (e.g., at block 610). For example, the machine learning system 210 may receive a test seismic dataset associated with a known truth interpretation. In some implementations, the test seismic dataset may be received from an operator or administrator via a user interface of the machine learning system 210.

The process 600 may also include receiving one or more hard constraints (e.g., at block 620). For example, the machine learning system 210 may receive one or more hard constraints associated with the test seismic data (e.g., from an operator of the machine learning system 210 and/or from a different interpretation system as described in FIG. 3). Examples of hard constraints may include legacy information about the study area from a previous geological survey, geologic/geophysical measurements, fault distribution indicative of the structural deformation history, etc.

The process 600 may further include associating the test seismic dataset and hard constrain(s) with the interpretation truth (e.g., at block 630). For example, the machine learning system 210 may associate the test seismic data (e.g., received at block 610) with the hard constraint(s) and the interpretation truth. In some embodiments, the machine learning system 210 may store information regarding the association in a data structure or storage system. In some embodiments, blocks 610 to 630 may be repeated iteratively to train the machine learning system 210 with multiple different datasets and associated interpretation truths to build an interpretation determination algorithm.

The process 600 may also include determine an error between a determined interpretation and interpretation truth (e.g., at block 640). For example, the machine learning system 210 may determine an interpretation of seismic data using its interpretation determination algorithm, and compare the determined interpretation with the interpretation truth. Further, the machine learning system 210 may determine an error of the interpretation prediction algorithm based on a deviation between the determined interpretation and the interpretation truth.

The process 600 may further include adjusting the error using one or more soft constraints (e.g., at block 650). For example, the machine learning system 210 may adjust the error using the soft constraint. As described above, the soft constraint may correspond to a policy that defines the manner and degree to which the error should be adjusted. Examples of soft constraints may include priority information, uncertainty levels, interpretation preference at specific stratigraphic intervals, etc. In some embodiments, a hard constraint may also be used as a soft constraint. For example, different values or types of hard constraints may be used to adjust the error differently.

The process 600 may also include updating the interpretation determination algorithm using the adjusted error (e.g., at block 660). For example, the machine learning system 210 may update the interpretation determination algorithm using the adjust error data. In some embodiments, the machine learning system 210 may update the interpretation determination algorithm by adjusting its interpretation of seismic data such that the error in interpretation is reduced. As an example, when the machine learning system 210 implements a neural network, the machine learning system 210 may use the adjusted error as part of back propagation to update the interpretation determination algorithm by adjusting prediction weightings. Block 660 may be repeated iteratively until the error is within a threshold. Each iteration of back propagation may use the soft constraint to adjust the error. Once the error is within a threshold, the machine learning system 210 may be considered to be trained in which the machine learning system 210 may implement an interpretation determination algorithm. However, even after the machine learning system 210 is considered to be trained, the process 600 may be repeated to refine and improve the interpretation determination algorithm.

Figure 7:
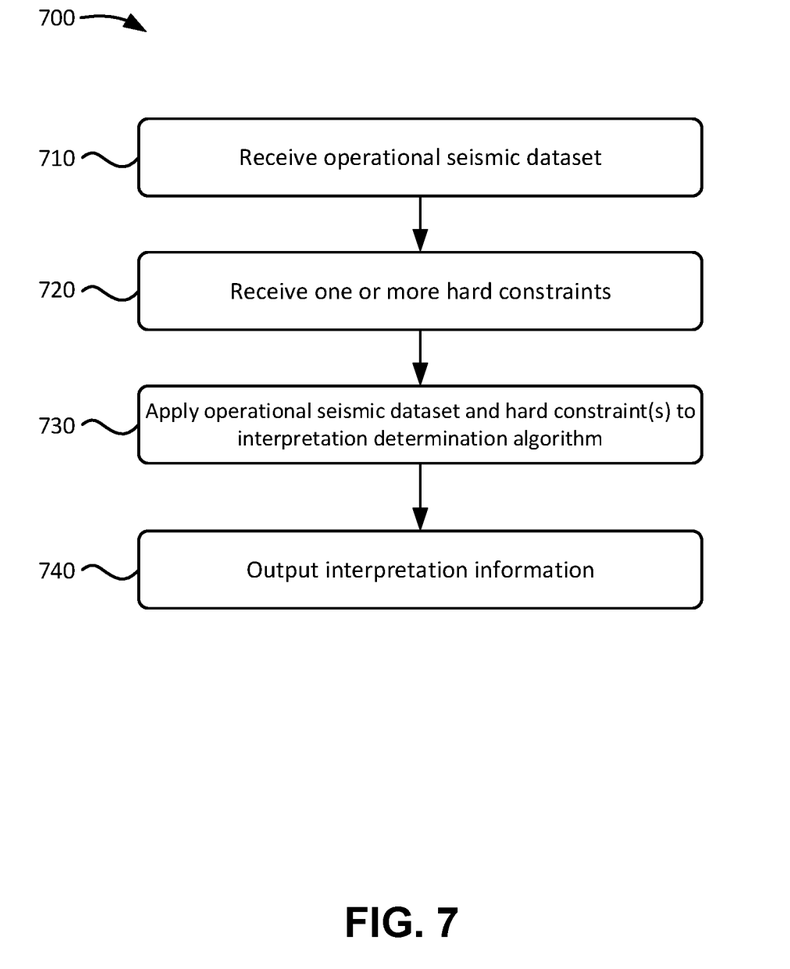
FIG. 7 illustrates an example flowchart of a process for using a trained machine learning system with an interpretation algorithm to interpret seismic data.

FIG. 7 illustrates an example flowchart of a process 700 for using a trained machine learning system with an interpretation algorithm to interpret seismic data. The steps of FIG. 7 may be implemented by the machine learning system 210 and/or similar type of computing device. As noted above, the flowchart illustrates the architecture, functionality, and operation of possible implementations of systems, methods, and computer program products according to various embodiments of the present disclosure.

As shown in FIG. 7, process 700 may include receiving operational seismic dataset (e.g., at block 710). For example, the machine learning system 210 may receive an operational seismic dataset (e.g., seismic data in which the interpretation is not known and to be determined). In some embodiments, the machine learning system 210 may receive the operational seismic dataset from a seismic data gathering system.

Process 700 may also include receiving one or more hard constraints (e.g., at block 720). For example, the machine learning system 210 may receive one or more hard constraints (e.g., from an operator of the machine learning system 210). As described herein, the hard constraint(s) may be used to more accurately interpret the seismic data by introducing an additional datapoint that may distinguish similar seismic datasets.

Process 700 may further include applying the operational seismic dataset and hard constraint(s) to the interpretation determination algorithm (e.g., at block 730). For example, the machine learning system 210 may apply the operational seismic dataset and the hard constraint(s) to the interpretation determination algorithm (e.g., generated by training the machine learning system 210 in accordance with the process 600 described above with respect to FIG. 6). In some embodiments, the machine learning system 210, using the interpretation determination algorithm, may identify a particular seismic dataset of multiple stored training seismic datasets, that substantially matches the operational seismic dataset and the hard constraint(s). In some embodiments, the machine learning system 210 may identify more than one possible match (e.g., interpretations) and may rank the possible matches using any suitable ranking system.

Process 700 may also include outputting interpretation information (e.g., at block 740). For example, the machine learning system 210 may output the interpretation information, specifically, the one or more possible interpretation matches from block 730. In some embodiments, the machine learning system 210 may output the interpretation information in the form of a report that presents the interpretation information as a graphic, table of values, chart, or a combination thereof. Additionally, or alternatively, the machine learning system 210 may output the interpretation information in conjunction with a computer-based instruction to perform an action based on the interpretation information (e.g., an instruction output an alert, adjust the operation of field equipment, etc.). Additionally, or alternatively, the machine learning system 210 may output the interpretation information as a seismic image or model representing a subterranean domain.

In some embodiments, block 720 of process 700 may be omitted. That is, the machine learning system 210 may interpret the seismic dataset without receiving a hard constraint and may identify an interpretation dataset that substantially matches the operational seismic dataset without regard to any hard constraints.

As described herein, process 700 uses a trained machine learning system 210 and a trained interpretation determination algorithm to interpret seismic data. Implementation of processes 600 and 700 may improve the speed, accuracy, and repeatability of seismic interpretation, which results in the improvement of petroleum exploration and production.

Figure 8:
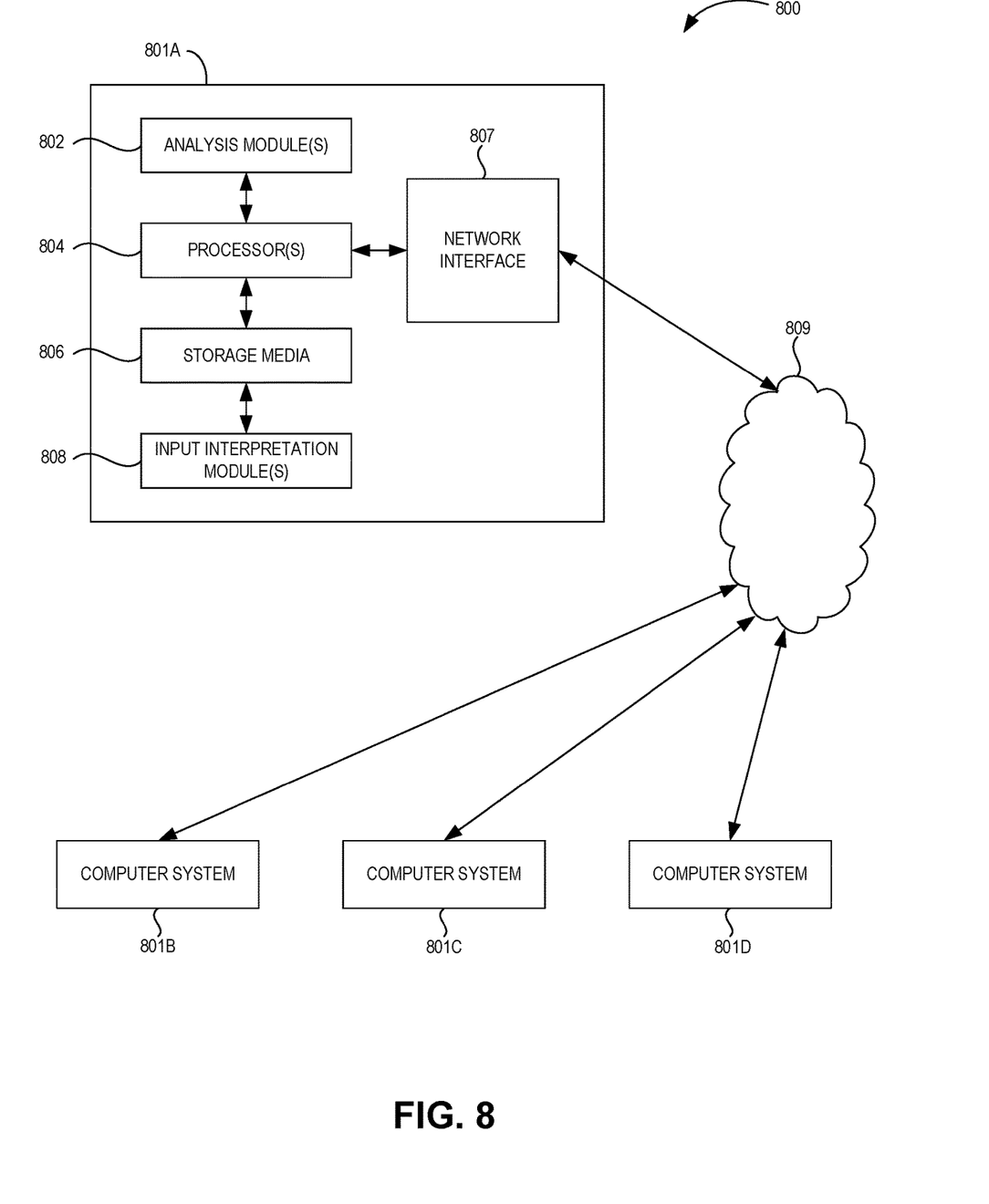
FIG. 8 illustrates a schematic view of a computing system, according to an embodiment.

In some embodiments, the methods of the present disclosure may be executed by a computing system. FIG. 8 illustrates an example of such a computing system 800, in accordance with some embodiments. The computing system 800 may include a computer or computer system 801A, which may be an individual computer system 801A or an arrangement of distributed computer systems. The computer system 801A includes one or more analysis modules 802 that are configured to perform various tasks according to some embodiments, such as one or more methods disclosed herein. To perform these various tasks, the analysis module 602 executes independently, or in coordination with, one or more processors 804, which is (or are) connected to one or more storage media 806. The processor(s) 804 is (or are) also connected to a network interface 807 to allow the computer system 801A to communicate over a data network 809 with one or more additional computer systems and/or computing systems, such as 801B, 801C, and/or 801D (note that computer systems 801B, 801C and/or 801D may or may not share the same architecture as computer system 801A, and may be located in different physical locations, e.g., computer systems 801A and 801B may be located in a processing facility, while in communication with one or more computer systems such as 801C and/or 801D that are located in one or more data centers, and/or located in varying countries on different continents).

A processor may include a microprocessor, microcontroller, processor module or subsystem, programmable integrated circuit, programmable gate array, or another control or computing device.

The storage media 806 may be implemented as one or more computer-readable or machine-readable storage media. Note that while in the example embodiment of FIG. 8 storage media 806 is depicted as within computer system 801A, in some embodiments, storage media 806 may be distributed within and/or across multiple internal and/or external enclosures of computing system 801A and/or additional computing systems. Storage media 806 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLURAY® disks, or other types of optical storage, or other types of storage devices. Note that the instructions discussed above may be provided on one computer-readable or machine-readable storage medium, or may be provided on multiple computer-readable or machine-readable storage media distributed in a large system having possibly plural nodes. Such computer-readable or machine-readable storage medium or media is (are) considered to be part of an article (or article of manufacture). An article or article of manufacture may refer to any manufactured single component or multiple components. The storage medium or media may be located either in the machine running the machine-readable instructions, or located at a remote site from which machine-readable instructions may be downloaded over a network for execution.

In some embodiments, computing system 800 contains one or more interpretation determination module(s) 808. In the example of computing system 800, computer system 801A includes the interpretation determination module(s)

808. In some embodiments, a single interpretation determination module 808 may be used to perform some aspects of one or more embodiments of the methods disclosed herein. In other embodiments, a plurality of interpretation determination modules 808 may be used to perform some aspects of methods herein.

It should be appreciated that computing system 800 is merely one example of a computing system, and that computing system 800 may have more or fewer components than shown, may combine additional components not depicted in the example embodiment of FIG. 8, and/or computing system 800 may have a different configuration or arrangement of the components depicted in FIG. 8. The various components shown in FIG. 8 may be implemented in hardware, software, or a combination of both hardware and software, including one or more signal processing and/or application specific integrated circuits.

Further, the steps in the processing methods described herein may be implemented by running one or more functional modules in information processing apparatus such as general purpose processors or application specific chips, such as ASICs, FPGAs, PLDs, or other appropriate devices. These modules, combinations of these modules, and/or their combination with general hardware are included within the scope of the present disclosure.

Computational interpretations, models, and/or other interpretation aids may be refined in an iterative fashion; this concept is applicable to the methods discussed herein. This may include use of feedback loops executed on an algorithmic basis, such as at a computing device (e.g., computing system 800, FIG. 8), and/or through manual control by a user who may make determinations regarding whether a given step, action, template, model, or set of curves has become sufficiently accurate for the evaluation of the subsurface three-dimensional geologic formation under consideration.

The foregoing description, for purpose of explanation, has been described with reference to specific embodiments. However, the illustrative discussions above are not intended to be exhaustive or limiting to the precise forms disclosed. Many modifications and variations are possible in view of the above teachings. Moreover, the order in which the elements of the methods described herein are illustrate and described may be re-arranged, and/or two or more elements may occur simultaneously. The embodiments were chosen and described in order to best explain the principals of the disclosure and its practical applications, to thereby enable others skilled in the art to best utilize the disclosed embodiments and various embodiments with various modifications as are suited to the particular use contemplated.

The flowchart and diagrams in the Figures illustrate the architecture, functionality, and operation of possible implementations of systems, methods, and computer program products according to various embodiments of the present disclosure. In this regard, each block in the flowchart or diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be apparent that different examples of the description provided above may be implemented in many different forms of software, firmware, and hardware in the implementations illustrated in the figures. The actual software code or specialized control hardware used to implement these examples is not limiting of the implementations. Thus, the operation and behavior of these examples were described without reference to the specific software code—it being understood that software and control hardware can be designed to implement these examples based on the description herein.

Even though particular combinations of features are recited in the claims and/or disclosed in the specification, these combinations are not intended to limit the disclosure of the possible implementations. In fact, many of these features may be combined in ways not specifically recited in the claims and/or disclosed in the specification. Although each dependent claim listed below may directly depend on only one other claim, the disclosure of the possible implementations includes each dependent claim in combination with every other claim in the claim set.

While the present disclosure has been disclosed with respect to a limited number of embodiments, those skilled in the art, having the benefit of this disclosure, will appreciate numerous modifications and variations there from. It is intended that the appended claims cover such modifications and variations as fall within the true spirit and scope of the disclosure.

No element, act, or instruction used in the present application should be construed as critical or essential unless explicitly described as such. Also, as used herein, the article "a" is intended to include one or more items and may be used interchangeably with "one or more." Where only one item is intended, the term "one" or similar language is used. Further, the phrase "based on" is intended to mean "based, at least in part, on" unless explicitly stated otherwise.

What is claimed is:

1. A computer-implemented method comprising:
receiving a test seismic dataset associated with a known truth interpretation;
receiving one or more hard constraints;
training a machine learning system based on the test seismic dataset, the known truth interpretation, and the one or more hard constraints;
determining an error value based on the training the machine learning system;
adjusting the error value based on one or more soft constraints;
updating the training of the machine learning system based on the adjusted error value;
receiving a second seismic dataset after the updating the training;
applying the second seismic dataset to the machine learning system to generate an interpretation of the second seismic dataset;
generating a seismic image representing a subterranean domain based on the interpretation of the second seismic dataset; and
outputting the seismic image.

2. The computer-implemented method of claim 1, wherein the interpretation of the second seismic dataset comprises at least one of a stratigraphy interpretation or a fault interpretation.

3. The computer-implemented method of claim 1, wherein the training the machine learning system comprises generating an interpretation generation algorithm, and the updating the training of the machine learning system comprises updating the interpretation generation algorithm.

4. The computer-implemented method of claim 1, wherein one of the one or more hard constraints is the same as the soft constraint.

5. The computer-implemented method of claim 1, wherein the one or more hard constraints includes at least one of:
   legacy information about a study area from a previous geological survey;
   geologic/geophysical measurements; and
   fault distribution indicative of structural deformation history.

6. The computer-implemented method of claim 1, wherein the soft constraint includes at least one of:
   priority information;
   uncertainty levels; and
   interpretation preference at specific stratigraphic intervals.

7. The computer-implemented method of claim 1, wherein the machine learning system comprises a neural network.

8. The computer-implemented method of claim 1, wherein the error value is used in back propagation to update the training of the machine learning system.

9. The computer-implemented method of claim 1, wherein the soft constraint comprises a policy for adjusting the error value.

10. The computer-implemented method of claim 1, wherein the outputting the seismic image comprises at least one of:
    outputting a report identifying information regarding the interpretation of the second seismic dataset;
    outputting an alert; and
    outputting an instruction to adjust operation of field equipment.

11. A computing system, comprising:
    one or more processors; and
    a memory system comprising one or more non-transitory computer-readable media storing instructions that, when executed by at least one of the one or more processors, cause the computing system to perform operations, the operations comprising:
       receiving a test seismic dataset associated with a known truth interpretation;
       receiving one or more hard constraints;
       training a machine learning system based on the test seismic dataset, the known truth interpretation, and the one or more hard constraints, wherein the one or more hard constraints represent an interpretation of the test seismic data by a separate machine learning system;
       determining an error value based on the training the machine learning system;
       adjusting the error value based on one or more soft constraints;
       updating the training of the machine learning system based on the adjusted error value;
       receiving a second seismic dataset after the updating the training;
       applying the second seismic dataset to the machine learning system to generate an interpretation of the second seismic dataset;
       generating a seismic image representing a subterranean domain based on the interpretation of the second seismic dataset; and
       outputting the seismic image.

12. The computer system of claim 11, wherein the interpretation of the second seismic dataset comprises at least one of a stratigraphy interpretation or a fault interpretation.

13. The computer system of claim 11, wherein the training the machine learning system comprises generating an interpretation generation algorithm, and the updating the training of the machine learning system comprises updating the interpretation generation algorithm.

14. The computer system of claim 11, wherein the machine learning system comprises a neural network.

15. The computer system of claim 11, wherein the error value is used in back propagation to update the training of the machine learning system.

16. The computer system of claim 11, wherein the soft constraint comprises a policy for adjusting the error value.

17. The computer system of claim 11, wherein the outputting the seismic image comprises at least one of:
    outputting a report identifying information regarding the interpretation of the second seismic dataset;
    outputting an alert; and
    outputting an instruction to adjust operation of field equipment.

18. A non-transitory computer-readable medium storing instructions that, when executed by one or more processors of a computing system, cause the computing system to perform operations, the operations comprising:
    receiving a test seismic dataset associated with a known truth interpretation;
    generating an interpretation determination algorithm by associating the test seismic dataset with the known truth interpretation;
    determining an error value associated with the interpretation determination algorithm;
    adjusting the error value based on one or more soft constraints;
    updating the interpretation determination algorithm based on the adjusted error value;
    receiving a second seismic dataset after the updating the interpretation determination algorithm;
    applying the second seismic dataset to the interpretation determination algorithm to generate an interpretation of the second seismic dataset;
    generating a seismic image representing a subterranean domain based on the interpretation of the second seismic dataset; and
    outputting the seismic image.

19. The computer-readable medium of claim 18, wherein the updating the interpretation determination algorithm based on the adjusted error value comprises using back propagation to update weightings associated with the interpretation determination algorithm.

20. The computer-readable medium of claim 18, wherein the interpretation determination algorithm is part of a neural network.

* * * * *